(12) United States Patent
Pekny et al.

(10) Patent No.: US 6,438,032 B1
(45) Date of Patent: Aug. 20, 2002

(54) NON-VOLATILE MEMORY WITH PEAK CURRENT NOISE REDUCTION

(75) Inventors: Theodore T. Pekny; Stephen J. Gualandri, both of Campbell, CA (US)

(73) Assignee: Micron Telecommunications, Inc., Boise, ID (US)

( * ) Notice: Subject to any disclaimer, the term of this patent is extended or adjusted under 35 U.S.C. 154(b) by 0 days.

(21) Appl. No.: 09/818,426

(22) Filed: Mar. 27, 2001

(51) Int. Cl.[7] .............................................. G11C 16/04
(52) U.S. Cl. ............................ 365/185.18; 365/185.25; 365/185.19
(58) Field of Search ........................ 365/185.18, 185.25, 365/185.19

(56) References Cited

U.S. PATENT DOCUMENTS

| 4,728,829 | A | * | 3/1988 | Tsujimoto | 307/590 |
|---|---|---|---|---|---|
| 5,113,372 | A | | 5/1992 | Johnson | |
| 5,126,590 | A | | 6/1992 | Chern | |
| 5,220,221 | A | | 6/1993 | Casper | |
| 5,818,289 | A | | 10/1998 | Chevallier et al. | |
| 5,999,456 | A | * | 12/1999 | Sali et al. | 365/185.28 |
| 6,026,042 | A | | 2/2000 | Shirley et al. | |
| 6,128,237 | A | | 10/2000 | Shirley et al. | |
| 6,154,088 | A | | 11/2000 | Chevallier et al. | |
| 6,281,716 | B1 | * | 8/2001 | Mihara | 327/80 |
| 6,307,425 | B1 | | 10/2001 | Chevallier et al. | |
| 6,356,481 | B1 | * | 3/2002 | Micheloni et al. | 365/185.18 |

* cited by examiner

*Primary Examiner*—Huan Hoang
(74) *Attorney, Agent, or Firm*—Fogg Slifer Polglaze Leffert & Jay, PA

(57) ABSTRACT

A non-volatile memory generates a pump voltage from a voltage source, which is typically a charge pump circuit or alternative source. The memory includes a non-volatile memory array having a plurality of memory cells. The pump voltage is utilized to erase or program the floating gate memory cells. After the non-volatile memory device completes an erase or programming operation, the pump voltage source is disabled. A discharge control circuit gradually discharges all of, or the initial component of, a remaining programming voltage charge to ground. The discharge control circuit, therefore, reduces noise caused by a large discharge current spike in the non-volatile memory device.

43 Claims, 13 Drawing Sheets

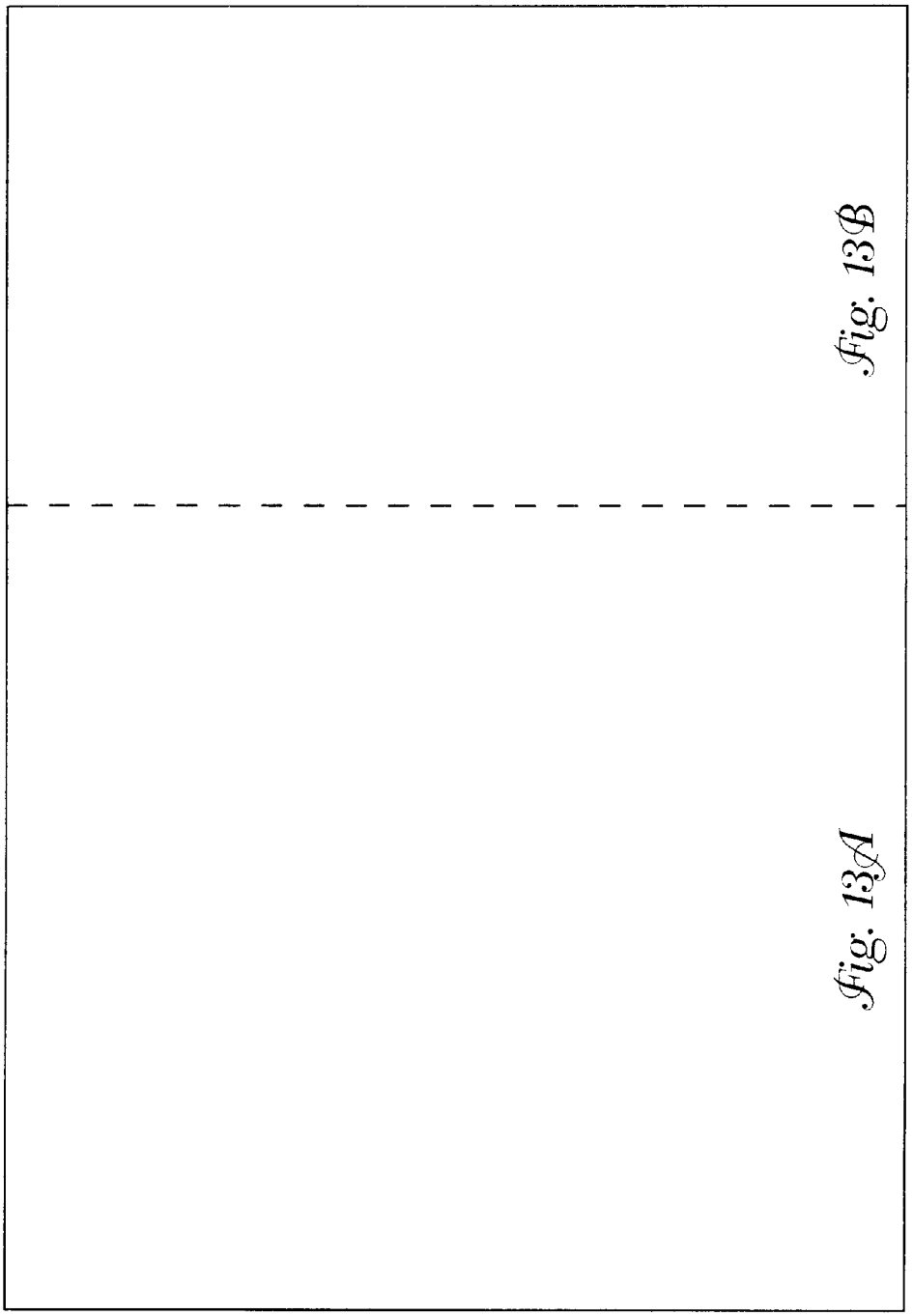

NON-VOLATILE MEMORY WITH PEAK CURRENT NOISE REDUCTION

TECHNICAL FIELD OF THE INVENTION

The present invention relates generally to integrated circuits and in particular the present invention relates to non-volatile memory devices with elevated program/erase voltage levels.

BACKGROUND OF THE INVENTION

The use of non-volatile memory systems that maintain data integrity when a power supply is removed are expanding rapidly in integrated circuit technology. A class of non-volatile memory systems having memory cells which have a source, a drain, a channel, a floating gate over the channel and a control gate are widely used. Two popular types of non-volatile memory designs in this class are electronically erasable and programmable read only memories (EEPROM) and FLASH erasable-programmable read only memory (EPROM). The FLASH EPROM or flash memory system allows the simultaneous erasure of multiple memory cells.

The floating gate of the memory cell stores data and are generally formed from polysilicon members completely surrounded by an insulator. A flash memory cell is programmed when a charge is stored on the floating gate. Moreover, a memory cell is un-programmed, or erased, when the charge is removed from the floating gate.

One method of programming a memory cell is accomplished by applying a positive potential (e.g., 4–7 V) to its drain and a programming potential (e.g., 10–15) to its control gate. This causes electrons to be transferred from the source to the floating gate of the memory cell. One method of erasing a memory cell is accomplished by applying a positive potential (e.g., 10–15 V) to its source while grounding the control gate and letting the drain float. This action removes electrons from the floating gate. The programming action of transferring electrons to the floating gate results in a memory cell that conducts less current when read than it would otherwise in the un-programmed state.

The flash memory may also include a charge pump or similar circuit that generates an elevated voltage, Vpp, used during programming of the memory cells and other internal operations. During write operations, Vpp is coupled to the memory cells for providing appropriate write operation programming power. Charge pump designs are known to those skilled in the art, and provides power which is dependant upon an externally provided supply of voltage Vcc.

The source of elevated programming voltage in a non-volatile memory should be discharged after a write or erase action takes place. This is typically accomplished by disabling the charge pump or other source of power and discharging the remaining charge in the source to ground. The spike of current that happens as this discharge occurs is a common source of noise in systems containing non-volatile memory devices, in particular for modern non-volatile memory systems with multiple independent sections. This noise needs to be addressed and reduced to avoid potential faults in the system and circuitry.

For the reasons stated above, and for other reasons stated below which will become apparent to those skilled in the art upon reading and understanding the present specification, there is a need in the art for a system to reduce discharge noise from programming voltage power sources in non-volatile memories and systems containing non-volatile memories.

SUMMARY OF THE INVENTION

The above-mentioned problems with memories and other problems are addressed by the present invention and will be understood by reading and studying the following specification.

In one embodiment, a memory device comprises a charge pump to provide an output voltage, and a discharge circuit coupled to discharge the output voltage of the charge pump. The discharge circuit has a controllable discharge current path to control a discharge time of the output voltage.

In another embodiment, a memory device comprises a charge pump to provide an output voltage on an output connection, and a discharge circuit coupled to the output connection of the charge pump. The discharge circuit comprises a discharge transistor coupled between the output connection of the charge pump and a discharge voltage connection, and a control transistor coupled between the output connection and a gate of the discharge transistor. The control transistor is selectively activated during operation of the charge pump. A capacitor is coupled to the gate of the discharge transistor. The capacitor is charged by the charge pump output voltage during the operation of the charge pump. A control circuit is provided with output node coupled to regulate a gate voltage of the discharge transistor such that the discharge transistor is operated in a linear region to control the discharge time of the output voltage. Finally, an isolation transistor is coupled between the gate of the discharge transistor and the control circuit.

In yet another embodiment, flash memory device comprises an array of non-volatile memory cells, a charge pump to provide a negative output voltage on an output node, control circuitry to control data states of the memory cells using the negative output voltage, and a discharge circuit coupled to the output node of the charge pump to discharge the negative voltage using a discharge transistor operated in a linear region to regulate a discharge current conducted by the discharge transistor.

A method of operating a memory device is provided that comprises generating a charge pump voltage on a charge pump output, and discharging the charge pump voltage using a regulated discharge circuit. The regulated discharge circuit provides an adjustable discharge time period.

Another method of operating a memory device is provided that comprises generating a negative charge pump voltage on a charge pump output when the charge pump is in an active mode, and charging a transistor to the negative charge pump voltage. The capacitor is coupled to a gate of an n-channel discharge transistor that is coupled to the charge pump output. The method further comprises providing a constant charging current to the capacitor when the charge pump is not in the active mode, such that a voltage of the capacitor is ramped from the negative charge pump voltage to a positive voltage to control a discharge current through the n-channel discharge transistor.

DETAILED DESCRIPTION OF THE INVENTION

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 1:
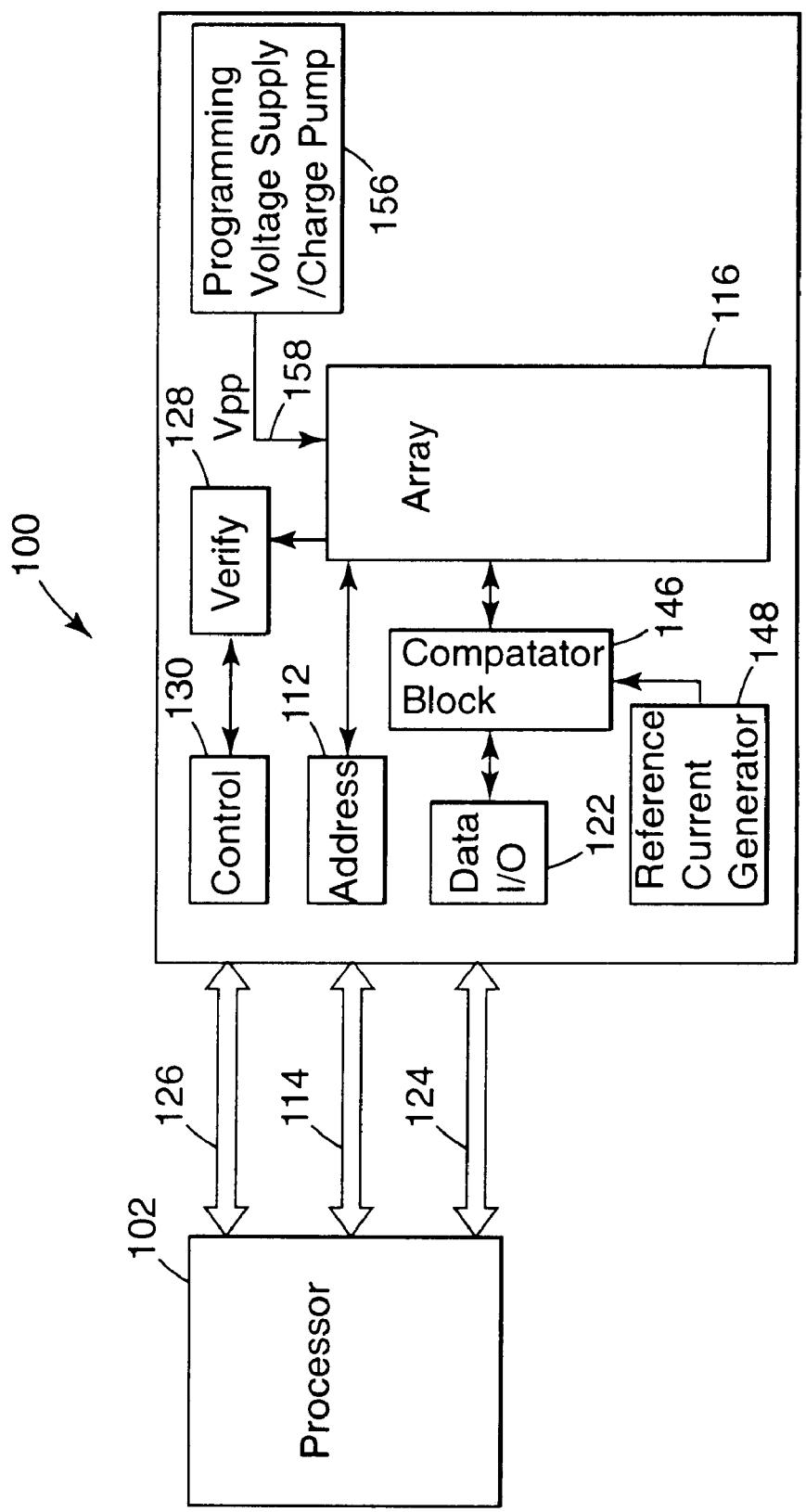
FIG. 1 is a simplified block diagram of a non-volatile memory of an embodiment of the present invention that is coupled to an exterior processor.

FIG. 1 illustrates a block diagram of a flash memory device 100 that is coupled to an external processor 102. The memory device 100 has been simplified to focus on features of the memory that are helpful in understanding the present invention. The memory device 100 includes an array 116 of memory cells 110. The memory cells 110 are illustrated in detail in FIG. 2. Some of the memory cells 110 are preferably floating gate memory cells, and the array 116 is arranged in blocks of rows and columns. The blocks allow the memory cells 110 to be erased in large groups. Data, however, is stored in the memory array 116 in small data groups (byte or group of bytes) and separate from the block structure. Erase operations are usually performed on a large number of cells in parallel.

Address decode circuitry 112 is provided to decode address signals provided on address lines A0–Ax 114. Address signals are received and decoded to access the memory array 116. Data input and output buffer circuits 122 are included for bi-directional data communication over a plurality of data (DQ) lines 124 with the external processor 102. Control circuit 130 decodes signals provided on control lines 126 from the external processor 102. These signals are used to control the operations of the memory, including data read, date write, and erase operations. During a read operation data signals from memory cells 110 are selected from the memory array. The signals from the selected memory cells 110 are interpreted by the comparator 146, utilizing the reference current generator 148 before being buffered by the data input and output buffer circuits 122. Verify circuits 128 are included for verifying the state of a memory cell 110.

In addition, state machine(s) can be provided as part of the control circuitry to perform read, write and erase operations. The flash memory may also include a charge pump 156 or other circuitry that generates an elevated voltage, Vpp 158, used during programming of the memory cells 110 and other internal operations. During write or erase operations, Vpp is coupled to the memory cells 110 for providing appropriate write operation programming power. After an erase or write operation is performed, the charge remaining on Vpp, after the charge pump is turned off, must be dissipated. This is typically accomplished by sinking Vpp to ground through a discharge circuit. Charge pump designs are known to those skilled in the art, and provides power which is dependant upon an externally provided supply voltage, Vcc.

As stated above, the flash memory of FIG. 1 has been simplified to facilitate a basic understanding of the features of the memory. Further, it will be appreciated that more than one flash memory can be included in various package configurations. For example, flash memory cards can be manufactured in varying densities using flash memories.

Figure 2:
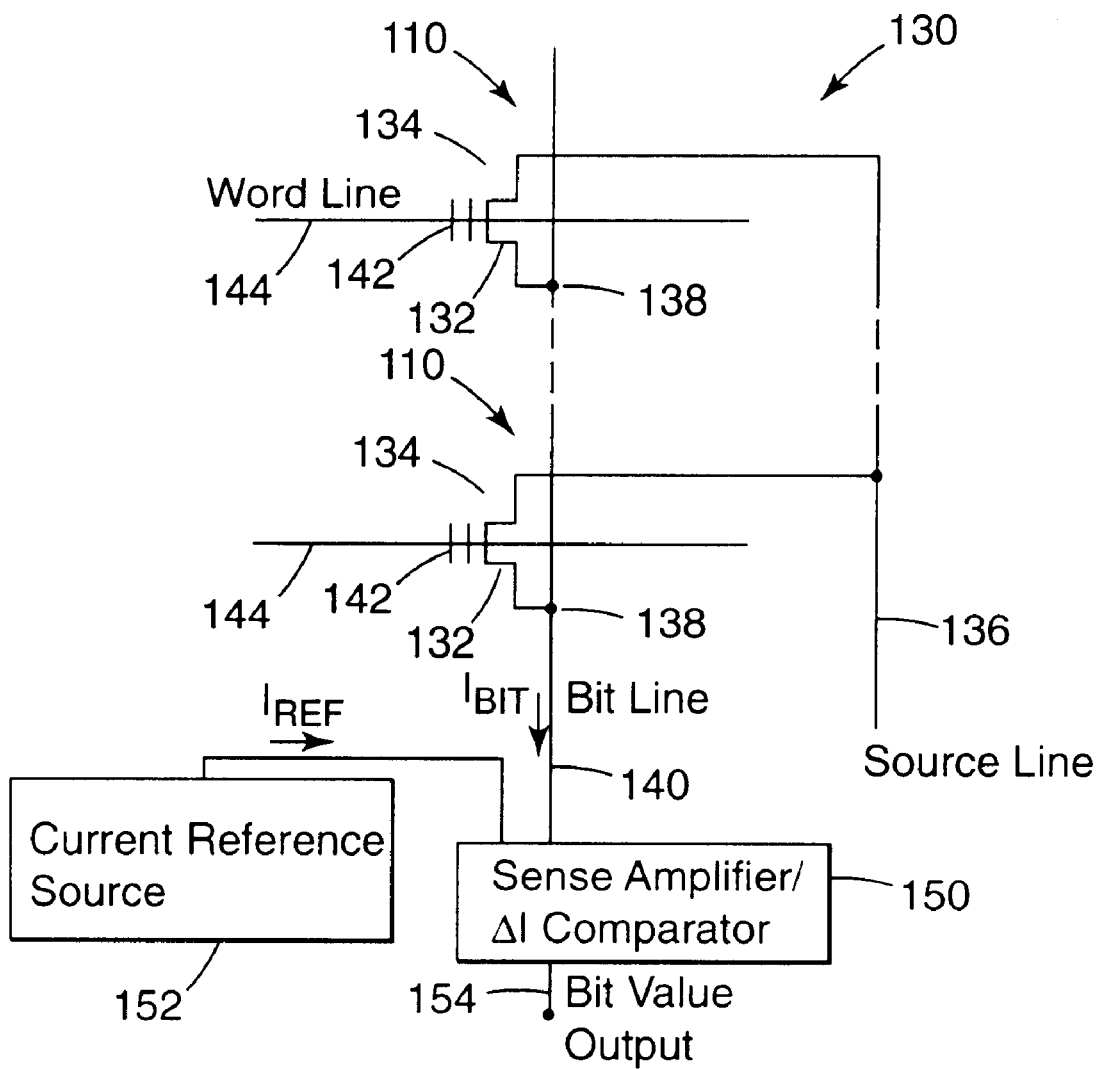
FIG. 2 is a simplified diagram of a flash memory device of an embodiment of the present invention showing a sense amplifier, word lines, and a column line.

A more detailed illustration of an embodiment 130 flash memory array 116 is provided in FIG. 2. As FIG. 2 illustrates, the memory cells 110 are made up of floating gate transistors 132 that are arranged in a plurality of rows and columns (only one column is illustrated). In the memory array, the source 134 of each memory cell in a row are connected to a common source line 136. The drain 138 of each memory cell in a column are connected to a common bit line 140. In addition, control gates 142 of each memory cell 110 in a row are connected to a word line 144. The common bit line is connected to a sense amplifier/comparator 150 that detects the bit value stored in the memory cell 110. This bit value detection is accomplished by comparing the current ($I_{BIT}$) conducted through the bit line 140 by the selected memory cell 110 to a reference current, ($I_{REF}$), generated by a reference current source 152. The array of FIG. 2 has been simplified to illustrate the basic arrangement of memory cells and bit lines. Those skilled in the art will appreciate that the schematic diagram has been simplified to focus on the present invention and that additional rows and columns would be implemented to create a complete memory device.

Figure 3:
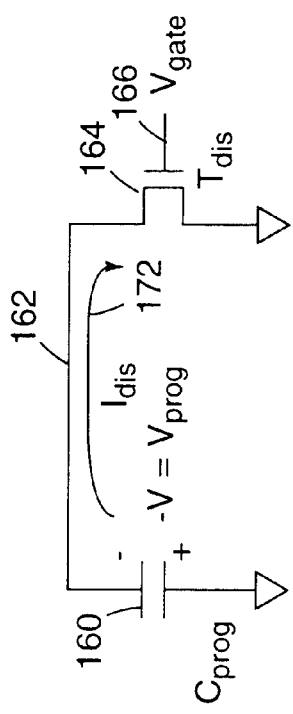
FIG. 3 is a simplified example of a programming voltage discharge circuit.
Figure 4:
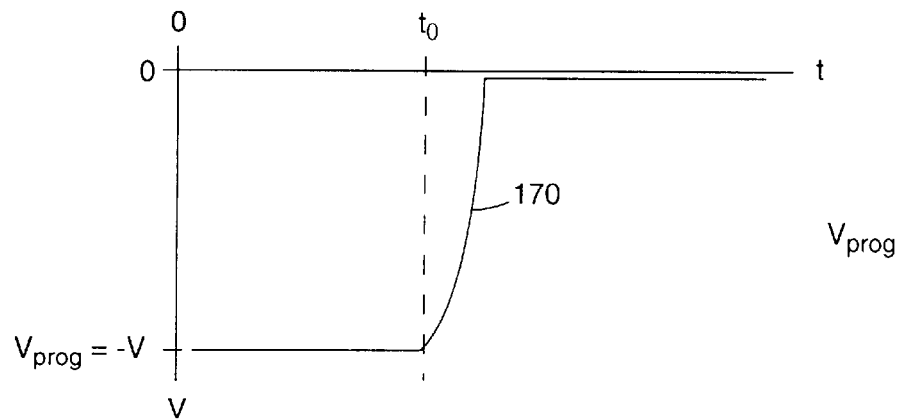
FIG. 4 is a graph of a load voltage waveform of the programming voltage discharge circuit of FIG. 3.
Figure 5:
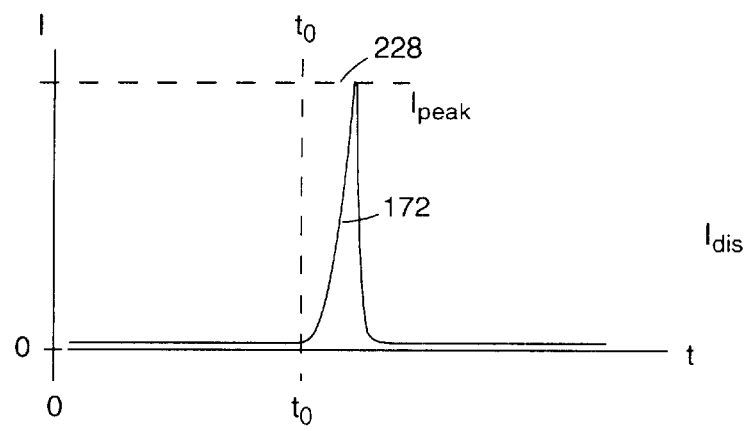
FIG. 5 is a graph of a current discharge waveform of the programming voltage discharge circuit of FIG. 3.
Figure 6:
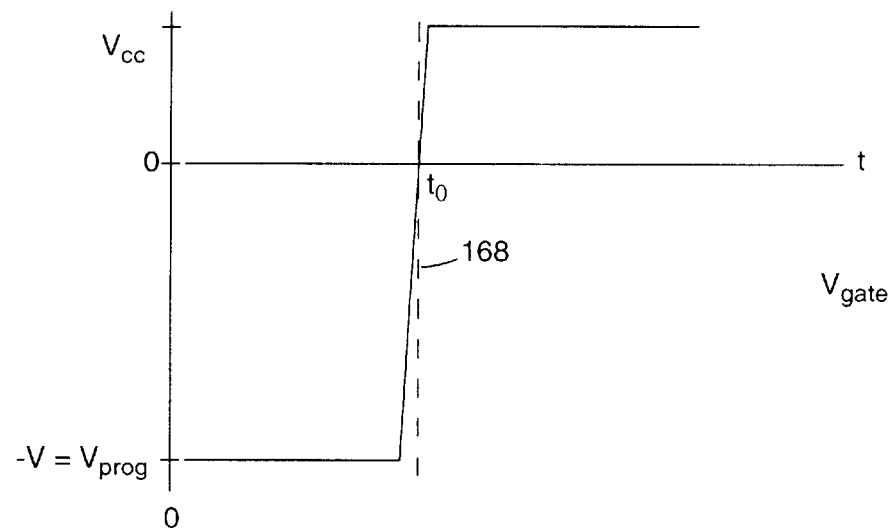
FIG. 6 is a graph of a gate control voltage of the discharge transistor of the programming voltage discharge circuit of FIG. 3.

A simplified view of a discharge circuit with a minimally controlled discharge path is shown in FIG. 3. In this circuit the capacitive load of the disabled charge pump (not shown) is represented by capacitor $C_{prog}$ 160 and is charged to a voltage $V_{prog}$=−V. Capacitor $C_{prog}$ 160 is coupled to a NMOS discharge transistor, $T_{dis}$ 164, through circuit node 162. At time to the gate drive control voltage, $V_{gate}$, 166 of discharge transistor $T_{dis}$ 164 transitions from inactive (low=−V) to active (high=Vcc). This transition by the gate drive, $V_{gate}$, is shown in FIG. 6. The transition of $V_{gate}$ turns on discharge transistor $T_{dis}$ 164 and starts to discharge the capacitive load $C_{prog}$ 160. The voltage of the capacitive load, $V_{prog}$, transitions quickly from −V to ground after time $t_0$. This can be seen in the graph of $V_{prog}$ 170 in FIG. 4. Because of this quick transition and discharge, the discharge current flow $I_{dis}$ 172 has a large current spike, $I_{peak}$ 228, as is shown in FIG. 5, that can be the source of much undesirable ground noise if the circuit is implemented in a non-volatile memory.

Figure 7:
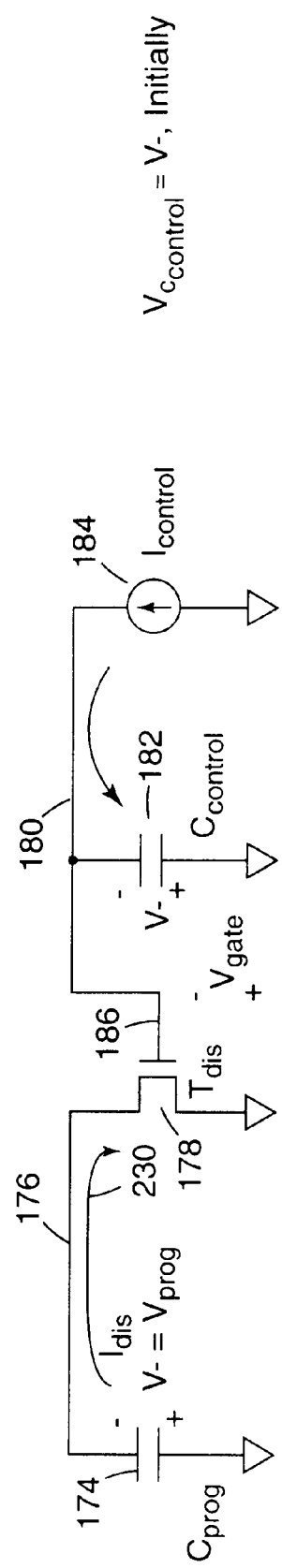
FIG. 7 is an example of a simplified programming voltage discharge circuit with rate control of an embodiment of the present invention.

FIG. 7 contains an embodiment of the present invention and shows a discharge circuit further enhanced over that of FIG. 3 by the addition of a discharge transistor control circuit. This control circuit is represented by a coupled capacitor $C_{control}$ 182 and current source $I_{control}$ 184. In this discharge circuit, capacitor $C_{control}$ 182 is initially charged to the negative programming voltage $V_{prog}$=−V and is coupled to the gate 186 of discharge transistor 178, keeping it turned off. At time to, control current source 184 starts to flow current $I_{control}$ through circuit node 180 and begins to charge capacitor $C_{control}$ 182. As capacitor $C_{control}$ 182 charges, the voltage it applies to the discharge transistor control gate 186 through circuit node 180 rises gradually from −V to Vcc, activating discharge transistor 178. This slow rise of gate drive voltage on discharge transistor 178 has the effect of dampening a current flow spike, $I_{peak}$, of $I_{dis}$ 230 of $C_{prog}$ 174 as it discharges through discharge transistor 178. This dampening effect is illustrated in the currents $I_{peak0}$ 232, $I_{peak1}$ 234, and $I_{peak2}$ 236 of FIG. 10; wherein $I_{peak0}$ 232 is an un-dampened current.

Figure 8:
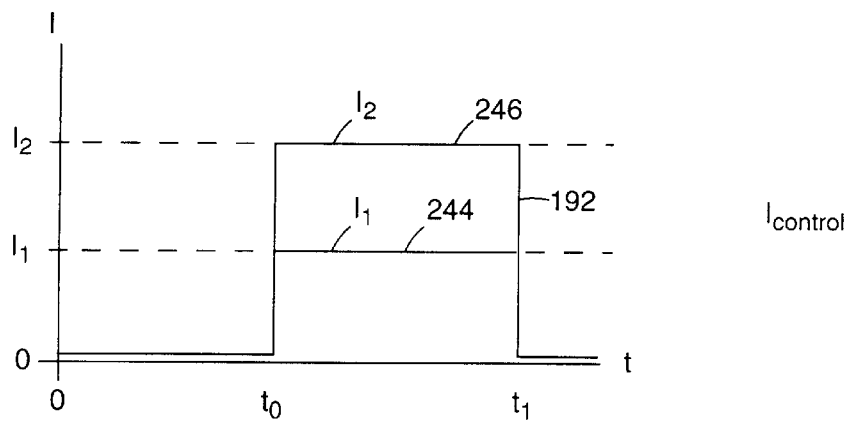
FIG. 8 is a graph of control current waveforms for the programming voltage discharge circuit of FIG. 7.

The discharge circuit of FIG. 7 can be driven by differing rates of current flow from the current source $I_{control}$ 184, as illustrated by $I_1$ 244 and $I_2$ 246 of FIG. 8. This gives different rates of discharge of capacitive load $C_{prog}$ 174 through the discharge transistor, $T_{dis}$ 178.

Figure 9:
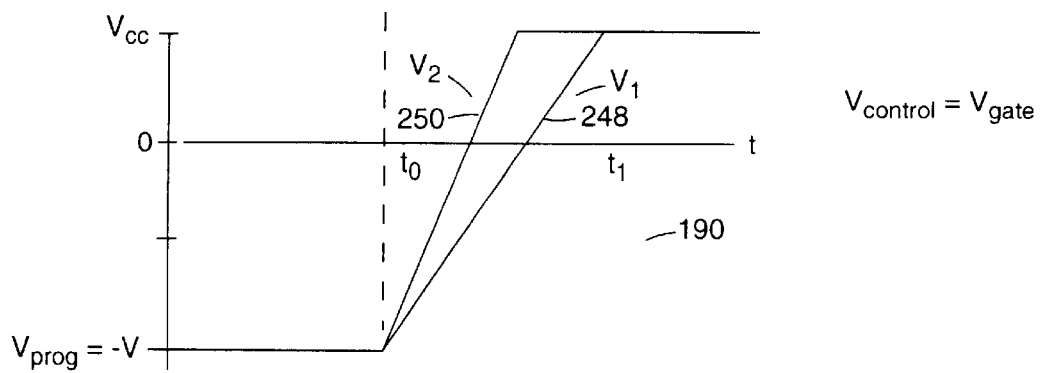
FIG. 9 is a graph of control voltage waveforms for a discharge transistor of the programming voltage discharge circuit of FIG. 7.
Figure 10:
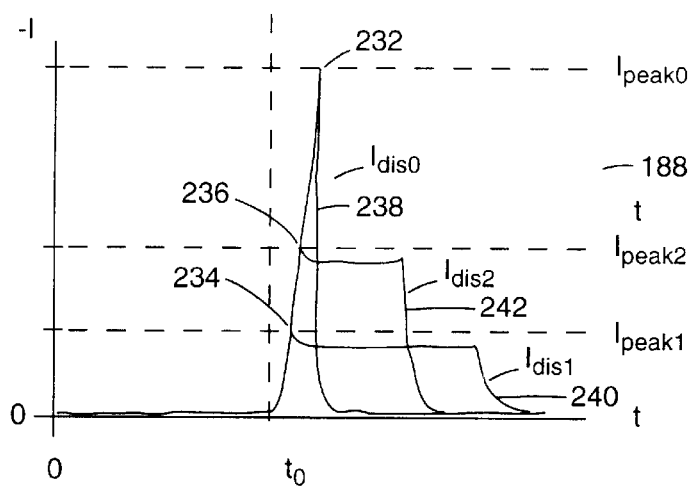
FIG. 10 is a graph of discharge current waveforms for the programming voltage discharge circuit of FIG. 7.

These differing rates of control current from current source 184 charge capacitor $C_{control}$ at differing rates. This generates differing rising control voltages on gate input 186 with different ramp rates as is shown in FIG. 9. In FIG. 9 the gate control voltage ($V_{gate}$) ramp of $V_1$ 248 corresponds to a current of $I_1$ 244 in FIG. 8 from the current source $I_{control}$ 184, and the voltage ramp $V_2$ 250 of FIG. 9 to current $I_2$ 246 of FIG. 8. The corresponding discharge currents from capacitive load $C_{prog}$ 174 of FIG. 7 through the discharge transistor 178 are shown in FIG. 10. In FIG. 10 current $I_{dis0}$ 238 with a peak of $I_{peak0}$ 232 are shown for comparison and correspond to an un-ramped (step function) $V_{gate}$ such as that of FIG. 6. The currents $I_{dis1}$ 240 and $I_{peak1}$ 234 in FIG. 10 correspond to the $V_{gate}$ 180 ramp of $V_1$ 248 and an $I_{control}$ 184 of $I_1$ 244. And the currents $I_{dis2}$ 242 and $I_{peak2}$ 236 of FIG. 10 correspond to a $V_{gate}$ 180 ramp of $V_2$ 250 of FIG. 9 and an $I_{control}$ 184 of $I_2$ 264 of FIG. 8 respectively.

Figure 11:
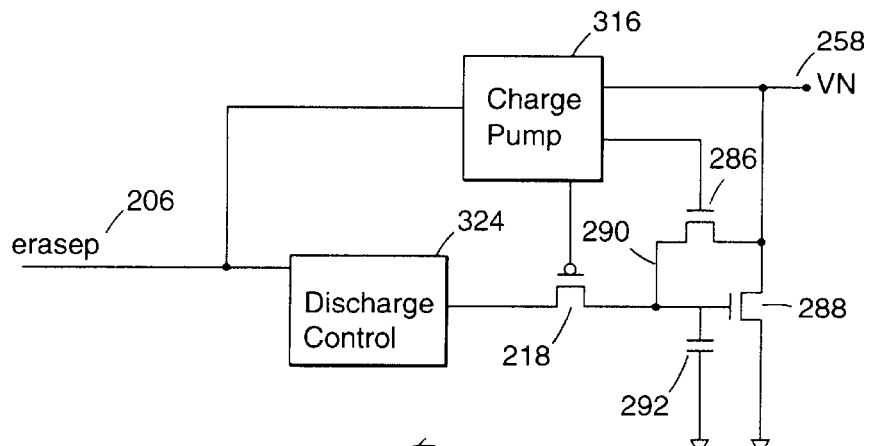
FIG. 11 is an example of a programming voltage discharge circuit with rate control of an embodiment of the present invention.

Shown in FIG. 11 is a schematic of a memory device discharge circuit and charge pump circuit of one embodiment of the present invention. In this schematic, the charge pump 316 is responsible for generating the elevated programming voltage required for the erasure and programming of non-volatile memory cells by the memory device containing the discharge circuit and charge pump of FIG. 11. The charge pump 316 is enabled by an active signal (high) on signal line erasep 206 when the memory device containing the circuit of FIG. 11 performs an erase/programming operation. The programming voltage (−V) generated by the charge pump 316 is placed on the signal output VN 258. After an erase/programming operation takes place, the signal erasep 206 transitions to inactive (low), deactivating the charge pump 316 and enabling the discharge control circuit 324. The discharge control circuit 324 controls the discharge of the remaining programming voltage charge from the charge pump output VN 258 to ground through NMOS discharge transistor 288. Transistor 288 is normally turned off by capacitor 292. During discharge, the gate of transistor 288 is raised so that the transistor operates in a linear region for a specified time period to discharge a portion of the pump voltage in a controlled, ramped manner. After a first time period, transistor 288 can be driven into saturation to quickly discharge any remaining portion of the pump voltage.

When the memory device performs an erase/programming operation, charge pump 316 of FIG. 11 is active and providing a programming voltage (−V) at signal output VN 258. The charge pump 316, when active, turns on NMOS transistor 286 and couples circuit node 290 to the programming voltage (−V) on output VN 258. The presence of the negative programming voltage (−V) on circuit node 290 ensures that the NMOS discharge transistor 288 is inactive and not conducting to ground while the charge pump is active. Additionally, the coupling of the negative programming voltage (−V) to node 290 charges the discharge control capacitor 292 to the negative programming voltage (−V). The charge pump 316, while active, also turns off PMOS transistor 218 and isolates the discharge control circuit 324 from circuit node 290 and the negative programming voltage (−V) now present on it.

After an erase/programming operation, the signal erasep 206 to inactive (low) and the charge pump is deactivated. NMOS transistor 286 is turned off, isolating circuit node 290 from the voltage on the signal output VN 258. At the same time, the PMOS transistor 218 is turned on and couples the discharge control circuit to circuit node 290, which is maintained at the negative programming voltage (−V) by the charged discharge control capacitor. The transition of the signal erasep 206 to inactive (low) also enables the discharge control circuit 324, which provides a control current flow through PMOS transistor 218 to circuit node 290. This control current flow gradually charges the discharge control capacitor 292. As the discharge control capacitor 292 charges the voltage signal on circuit node 290 gradually rises from the negative programming voltage (−V) to Vcc. Circuit node 290 is coupled to the gate of the NMOS discharge transistor 288 and the rising voltage on circuit node 290 activates the discharge transistor to slowly discharge the residual programming charge from signal output 258 and the disabled charge pump 316.

After discharge of the residual programming charge from signal output 258, the discharge control circuit 324 maintains a bias on the gate of discharge transistor 288. This keeps the discharge transistor 288 enabled until the next erase/programming operation.

Figure 12:
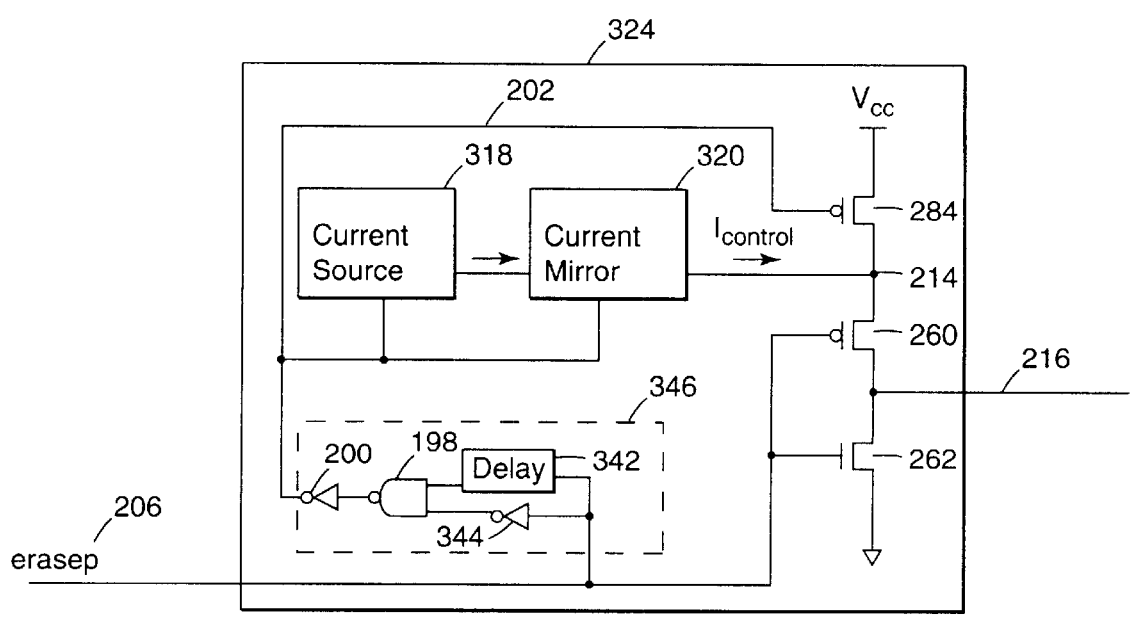
FIG. 12 is an example of a discharge control circuit of a programming voltage discharge circuit of an embodiment of the present invention.

Shown in FIG. 12 is a schematic of a discharge control circuit such as would be used by the discharge control 324 of FIG. 11. The discharge control circuit of FIG. 12 is enabled by a timed signal pulse generated by the one-shot pulse circuit 346 on to circuit node 202 when the signal erasep 206 transitions from active (high) to inactive (low). When the discharge control circuit is active, a control current is generated by the current source 318 and replicated by current mirror 320 on circuit node 214 to circuit node 216. In the discharge control and charge pump circuit of FIG. 11, circuit node 216 is coupled via PMOS transistor 218 to circuit node 290, discharge transistor 288, and discharge control capacitor 292.

When the control signal erasep 206 is not transitioning from active (high) to inactive (low), the discharge control circuit of FIG. 12 is inactive, and the signal generated by circuit 346 on circuit node 202 is inactive (low). With the signal on circuit node 202 inactive, current source 318 and current mirror 320 are disabled. Additionally, an inactive (low) signal on circuit node 202 activates PMOS transistor 284 and it couples circuit node 214 to Vcc.

The output of the discharge control circuit of FIG. 12 on circuit node 216 is coupled to either circuit node 214 or to ground by the action of control signal erasep 206 on NMOS transistor 262 and PMOS transistor 260. When the memory device containing the discharge control circuit of FIG. 12 in an erase/program operation the control signal erasep 206 is active (high) and NMOS transistor 262 is turned on coupling the output circuit node 216 to ground. When signal erasep 206 is inactive the NMOS transistor 262 is turned off and PMOS transistor 260 is turned on, coupling the output circuit node 216 to circuit node 214. Circuit node 214, is coupled to current mirror 320 when the control pulse from circuit 346 on circuit node 202 is active (high) or to Vcc through PMOS transistor 284 when the signal on circuit node 202 is inactive (low). When timed signal pulse of circuit 346 of FIG. 12 on circuit node 202 is not active, circuit node 214 is pulled high to Vcc by PMOS transistor 284. It is noted that the time period of the control signal pulse from circuit 346 on circuit node 202 of FIG. 12 may be varied. This allows part or all of the discharge of the remaining programming voltage charge of the charge pump 316 of FIG. 11 and programming voltage output to happen gradually, under control of the current mirror 320 current source of the discharge control circuit of FIG. 12, with the remainder under the less gradual control of the pull up PMOS transistor 284.

As stated above, circuit 346 generates an active signal pulse on circuit node 202 after the transition of coupled control signal erasep 206 from active (high) to inactive (low). The signal erasep 206 is coupled through inverter 344 to a first input of the NAND gate 198. Additionally, a second input of NAND gate 198 is coupled to erasep 206 through delay element 342, and the output of the NAND gate 198 is coupled to circuit node 202 through inverter 200. Inverter 344 continually expresses the inverse of signal erasep 206 to one of the inputs of NAND gate 198. When erasep 206 transitions from active (high) to inactive (low) the input signals to NAND gate 198 will both be active (high) for only the time period set by the delay element 342. At this time the new inactive (low) state of erasep 206 is propagating through the delay element 342 and it still is expressing an active (high) signal from the previous state of erasep 206. At all other times the signal output from circuit 346 by NAND gate 198 on to circuit node 202 through inverter 200 will be inactive (low).

When the memory device containing the discharge control circuit of FIG. 12 begins an erase/program operation, the signal erasep 206 is changes from inactive (low) to active (high). The active signal erasep 206 turns on NMOS transistor 262 and couples the output circuit node 216 to ground. The active signal erasep 206 also turns off PMOS transistor 260 and isolates circuit node 214, and the remainder of the discharge control circuit from the output circuit node 216. During the transition of signal erasep 206 from inactive (low) to active (high), the sequence of signals generated from signal erasep 206 through inverter 344 and delay element 342 on their separate inputs to NAND gate 198 will not cause the NAND gate change state. Therefore the inactive signal (low) expressed by the NAND gate 198 on circuit node 202 through inverter 200 stays unchanged. The inactive (low) signal on circuit node 202 continues to disable the current source 318 and current mirror 320, and maintains the PMOS transistor 284 in the on state and coupling circuit node 214 to Vcc.

Figure 13A:
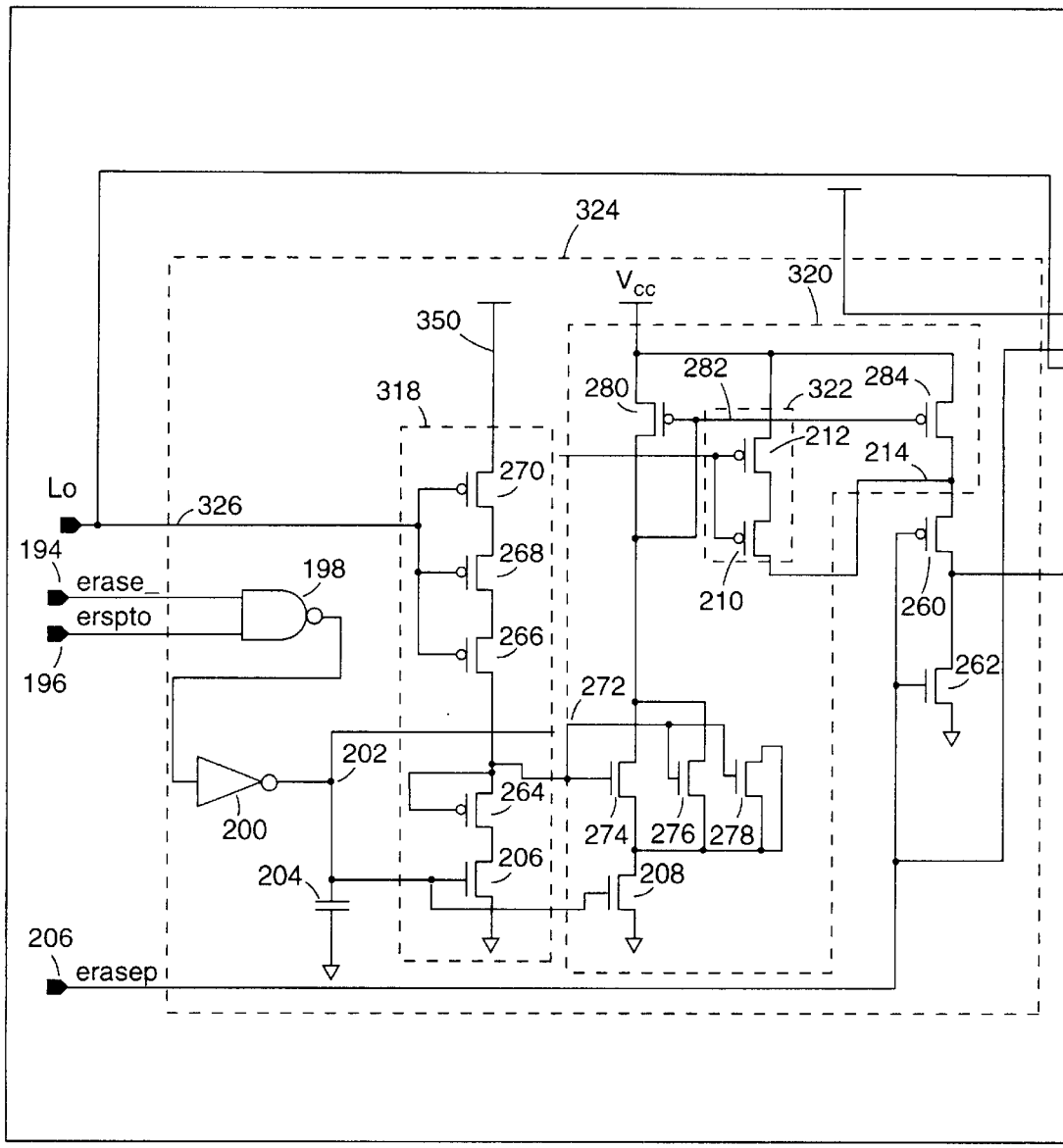
FIG. 13 including FIG. 13A
FIG. 13B is another detailed example of a programming voltage discharge circuit with rate control of an embodiment of the present invention.
Figure 13B:
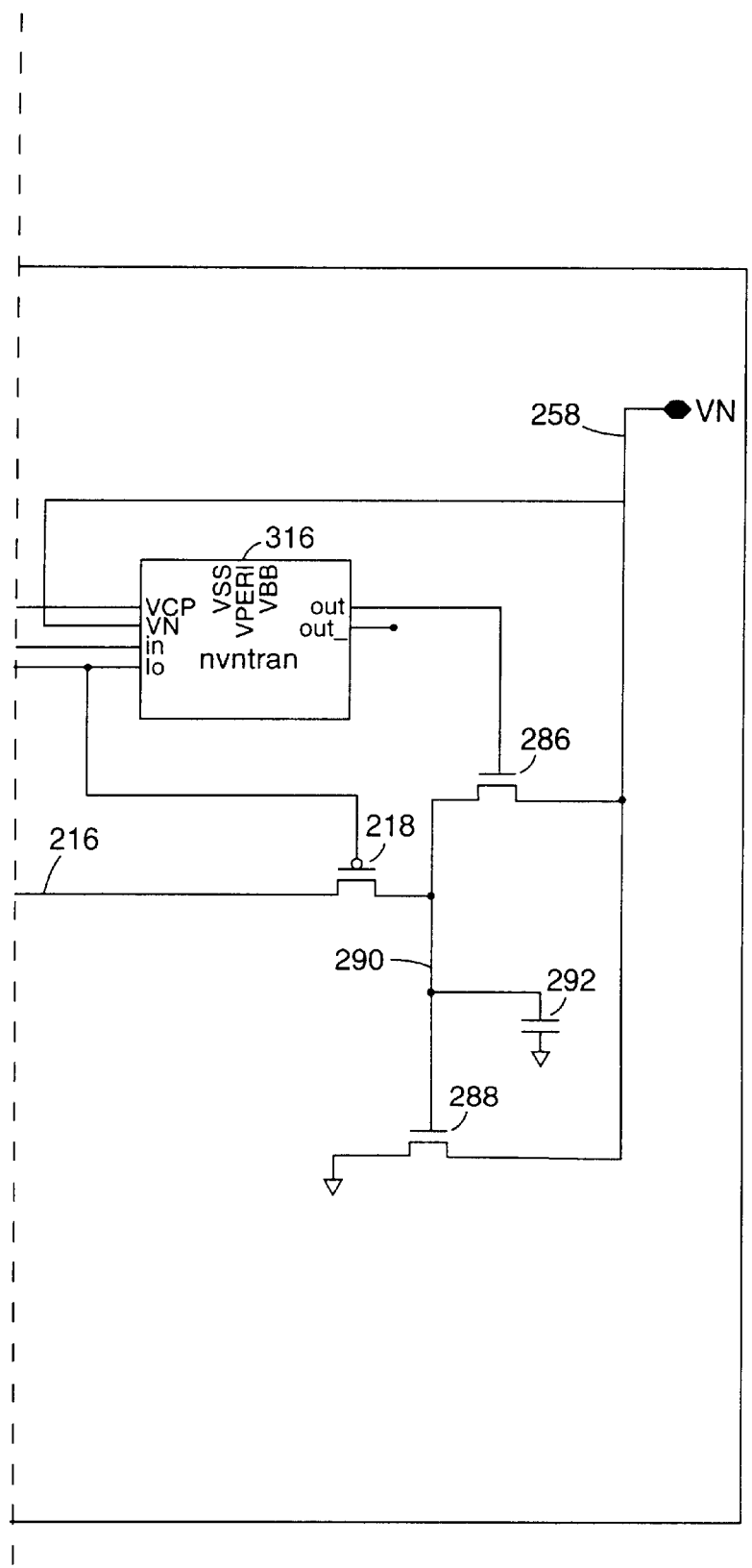

Shown in FIG. 13 is a schematic of an additional embodiment of a memory device discharge circuit of one embodiment of the present invention. When the memory device containing the memory discharge circuit of FIG. 13 is in an erase/programming operation, an elevated programming voltage (−V, such as −10V) is provided by the charge pump 316 on the output signal VN 258. After an erase/programming operation, the charge pump 316 is turned off and the residual programming voltage charge is discharged to ground through discharge transistor 288 under control of the discharge control circuit of circuit 324 and discharge control capacitor 292.

When the charge pump 316 is active, PMOS transistor 218 is turned off, isolating the discharge control circuit of circuit 324 from circuit node 290. Additionally, NMOS transistor 286 is enabled and couples circuit node 290 to the negative programming voltage (−V) on output node VN 258. The negative programming voltage (−V) from output node VN 258 is thus applied to discharge control capacitor 292 and the gate of discharge transistor 288, ensuring that transistor 288 is turned off during an erase/programming operation and discharge control capacitor 292 is charged to the negative programming voltage (−V).

After an erase/programming operation, the charge pump 316 is disabled and transistor 286 is turned off, isolating circuit node 290 from the output node VN 258, and transistor 218 is turned on, coupling circuit node 290 to the enabled discharge control circuit of circuit 324 via circuit node 216. As the discharge control circuit of circuit 324 sources a control current to the discharge control capacitor 292 via circuit nodes 216 and 290 the voltage signal on circuit node 290 rises. The control current is generated for the discharge control circuit of circuit 324 by the current source contained in circuit 318. The current is replicated on to circuit node 216 by the current mirror circuit contained in circuit 320. The rising voltage on circuit node 290 activates the NMOS discharge transistor 288 and gradually discharges the remaining programming voltage charge on output node VN 258 to ground.

Figure 14:
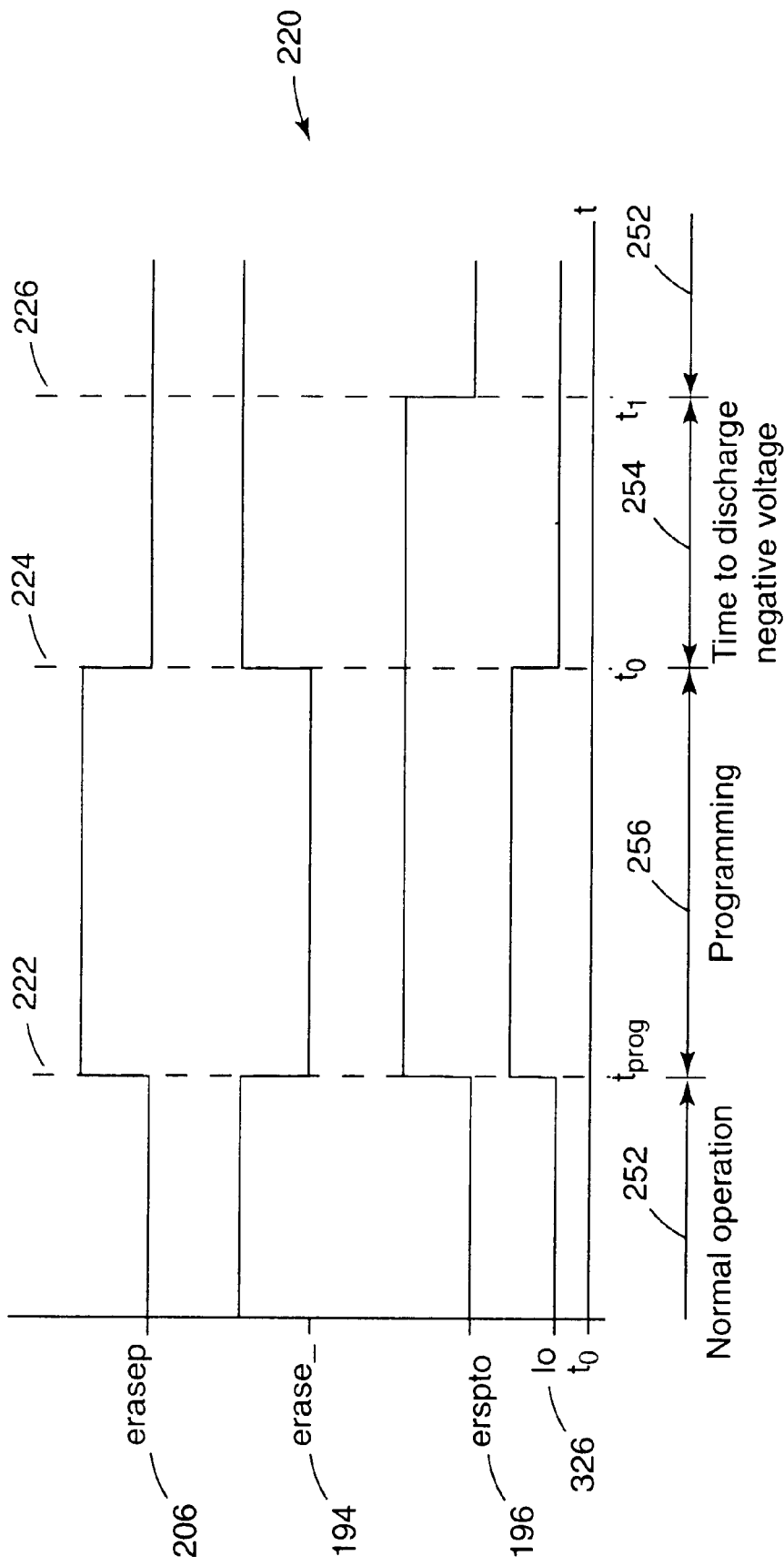
FIG. 14 is a graph of control signals for the programming voltage discharge circuit of FIG. 13.

The memory device discharge circuit of FIG. 13, unlike that of FIG. 11, is controlled by control signals erspto 196 (erase pulse), erasep 206, lo 326, and erase_ 194 (active low). As shown in the accompanying control signal waveforms 220 of FIG. 14, during normal operation 252 all four signals are inactive. During an erase/program operation 256 ($t_{prog}$–$t_0$) the charge pump system 316 of FIG. 14 is activated by the memory device to provide an elevated programming voltage for the non-volatile memory cells and all four signals are active. After an erase/program operation, $t_0$ 224, the erase operation completes and the charge pump is deactivated and the remaining charge is discharged. At time $t_0$ 224 erasep 206, lo 326, and erase_ (active low) 194 go inactive, the signal erspto 196, however, stays active until time $t_1$ 226 and allows the discharge of the charge pump's remaining capacitive charge. After time $t_1$ 226, the discharge operation ends and erspto 196 goes inactive, resuming normal operation 252 of the memory device.

For most of the sequence of the control signal waveforms of FIG. 14, except for the period between $t_0$ 224 and $t_1$ 226, the discharge circuit of FIG. 13 is disabled. When the discharge circuit is in the disabled state, the signals erase_ (active low) 194, erasep 206, lo 326, and erspto 196 are either all active (the memory device is in the erase/ programming mode 256 of FIG. 14) or, alternatively, all inactive (the memory device is in the normal mode 252 of FIG. 14). In the discharge circuit of FIG. 13, the signals erase__194 (active low) and erspto 196 (active high), are both coupled to inputs of NAND gate 198. Therefore when these signals are either both active or inactive, the output of the NAND gate 198 is a logical one (high). This logical one (high) output of the active NAND gate 198 is coupled to inverter 200 and its output is coupled to circuit node 202 which is therefore driven to a logical zero (low) state.

With circuit node 202 driven by inverter 200 to a logical zero (low) state, control capacitor 204 coupled between node 202 and ground is discharged and maintained at a low potential. Additionally, NMOS transistors 206 and 208, who's gates are coupled to circuit node 202, are turned off, preventing current flow from current source 318 and current mirror circuit 320. The logical zero signal (low) on circuit node 202 also drives the gates of PMOS transistors 212 and 210 of the pull up circuit 322, turning them on and coupling circuit node 214 to the positive power supply, Vcc.

When the discharge circuit of FIG. 13 is disabled (transistors 206 and 208 off, disabling current source circuit 318 and current mirror circuit 320), signal erasep 206 controls node 216 and the source of PMOS transistor 218. When the memory device is in the normal operation mode (time period 252 of FIG. 14) the charge pump circuit 316 is inactive and its output signal VN 258, is discharged to ground potential. Coupling transistor 286 is turned off in the normal mode (time period 252 of FIG. 14) by the active control signal lo 326. Circuit node 290 is electrically isolated from the charge pump output 258 so that it can be biased to maintain discharge transistor 288 in an on state. The signal erasep 206 is coupled to the gate of NMOS transistor 262 and to the gate of PMOS transistor 260. During normal operation mode 252, erasep 206 is inactive (low). This has the effect of turning off NMOS transistor 262, isolating circuit node 216 from ground, and turning on PMOS transistor 260. The active PMOS transistor 260 connects circuit node 216 to circuit node 214, which as stated above is coupled to Vcc via PMOS transistors 210 and 212 of pull up circuit 322 when the discharge circuit is in a disabled state. Circuit node 216 is coupled to circuit node 290 via PMOS transistor 218, which is maintained in an active state when the memory device is in the normal mode to provide a bias to maintain discharge transistor 288. Circuit node 290 is in turn coupled to the gate of discharge NMOS transistor 288 and discharge control capacitor 292. This maintains a bias of Vcc on the discharge control capacitor 292 and the gate of discharge NMOS transistor 288, turning it on and draining any residual charge from the charge pump output node 258, when the memory device is operating in the normal mode 252.

When the memory device containing the discharge circuit of FIG. 13 is in the erase/programming mode (time period 256 of FIG. 14), control signal erasep 206 is active (high). In this operating mode the charge pump is active and a programming voltage −V, such as −10V, is placed on the charge pump output 258. PMOS transistor 218 is off in this state and coupling transistor 286 is on connecting circuit node 290 to the charge pump output 258. This biases the gate of discharge NMOS transistor 288 and the discharge control capacitor 292 to −V, turning off discharge transistor 288 while the memory device is in the erase/programming mode. At this time the active signal erasep 206 disables the PMOS transistor 260 and enables the NMOS transistor 262, coupling circuit node 216 to ground. This biases the source PMOS transistor 218 to ground.

When the memory device containing the discharge circuit of FIG. 13 is in the discharge mode 254 of FIG. 14, the discharge circuit is enabled by the control signals erasep 206 and erase__ 194 (active low) being inactive, and erspto 206 being active. With the control signal erasep 206 inactive, NMOS transistor 262 is turned off and PMOS transistor 260 is turned on and the circuit node 216 is connected to circuit node 214 through the PMOS transistor 260. With erase__194 inactive (high) and erspto 196 active the output of the coupled NAND gate 198 is inactive (low). The NAND gate 198 therefore expresses an active (high) signal onto circuit node 202 through inverter 200.

Inverter 200 charges coupled capacitor 204. As the signal level on circuit node 202 rises to an active level (high), PMOS transistors 212 and 210 of pull up 322 are shut off and circuit node 214 is isolated from Vcc. Simultaneously, the voltage signal on node 202 activates NMOS transistors 206 and 208 enabling the current source circuit 318 and the current mirror circuit 320.

In the current source 318, as current flows through NMOS transistor 206, current is taken from the coupled source of the drain-gate connected NMOS transistor 264, lowering the voltage level on its source. The voltage level on the source of transistor 264 lowers to the point where the transistor is biased into the active region by the source to gate-drain differential and conducts the current set by regulated supply 350 (such as 2V) and the series coupled PMOS load transistors 266, 268, and 270 that are enabled by the inactive (low) signal lo 326. The gate voltage of NMOS transistor 264, in combination with the series coupled PMOS load transistors 266, 268, and 270, drive the gates of NMOS transistors 274 and 276 of current mirror circuit 320 in a current mirror configuration. The sources of NMOS transistors 274 and 276 are coupled to the drain of the NMOS transistor 208, which like NMOS transistor 206, has been activated by inverter 200. NMOS transistors 274 and 276, both conduct the same current as transistor 264. NMOS transistors 274 and 276 are coupled together at their source and drains and therefore have the effect of multiplying (doubling) the current flowing in transistor 264 with their combined currents. It is noted that this multiplying effect can be utilized to give the discharge control circuit of FIG. 13 an adjustable rate of discharge output. The combined current conducted by NMOS transistors 274 and 276 is coupled via their sources to NMOS transistor 208. The combined current flowing through NMOS transistors 274 and 276 is pulled from the drain of the drain-gate connected PMOS transistor 280. As current is pulled from the drain of transistor 280 the voltage signal on circuit node 282 and the gate of PMOS transistor 280 is lowered until transistor 280 just conducts the current required by NMOS transistors 274 and 276. The gate of PMOS transistor 284 is coupled to circuit node 282 and therefore is driven to conduct the same current as drain-gate connected PMOS transistor 280. That is, active transistor 260 and transistor 284 conduct a current equal to the current through transistor 280 from the current mirror circuit 320 onto circuit node 216.

When in the discharge mode, the inactive charge pump 316 of FIG. 13 turns off the NMOS coupling transistor 286 to electrically isolate circuit node 290 from the charge pump output 258 and its residual charge. The inactive (low) signal lo 326, enables PMOS transistor 218 to allow current to flow from circuit node 216 and the main discharge control circuit and begin the discharge cycle. This disconnects circuit node 290 from the charge pump output 258, where it had been maintained at −V when the memory device was in erase/programming mode, and couples it to circuit node 216.

Initially, because of the gate voltage from circuit node 290 being maintained at −V by discharge control capacitor 292, the NMOS discharge transistor 288 is turned off and no discharge current flows from the charge pump output VN 258 to ground. The constant current from the current mirror circuit 320 flows in to circuit node 290 from circuit node 216 via enabled PMOS transistor 218. Control capacitor 292 slowly charges in response to this control current flow and the voltage signal on circuit node 290 rises from −V. This rise in voltage on circuit node 290 gradually turns on NMOS discharge transistor 288 and allows discharge current to start to flow through it from the charge pump output 258 to ground. As control current continues to flow into the control capacitor 292 the voltage level on circuit node 290 continues to rise until it reaches the level of Vcc, gradually discharging the charge pump output to ground as it goes.

At the end of the discharge cycle the memory device containing the discharge circuit of FIG. 13 enters normal operation mode again. At this time control signals erasep 206, erase_194 (active low), lo 326, and erspto 196 all go inactive. The current mirror circuit shuts off, and the discharge transistor 288 is maintained at a bias of Vcc via circuit node 290 and node 216 to discharge any remaining bias on the charge pump output VN 258. It is noted that the period of time that signal erspto 196 remains active after erasep 206, erase_194 (active low), and lo 326 go inactive may be varied to allow part or all of the remaining programming voltage charge discharge to happen under the gradual discharge of the discharge control circuit of circuit 324 of FIG. 13. Any charge remaining to be discharged after erspto 196 goes inactive will be discharged under the less gradual control of the pull up circuit 322. This procedure would allow the time to discharge to be decreased while still retaining the benefits of the noise reduction of the full gradual discharge. It allows the initial discharge, which causes a majority of the generated noise, to be gradual. The programming voltage charge remaining after this, which is at a lower potential and charge density and thus not as noise causing, can be discharged faster.

Figure 15:
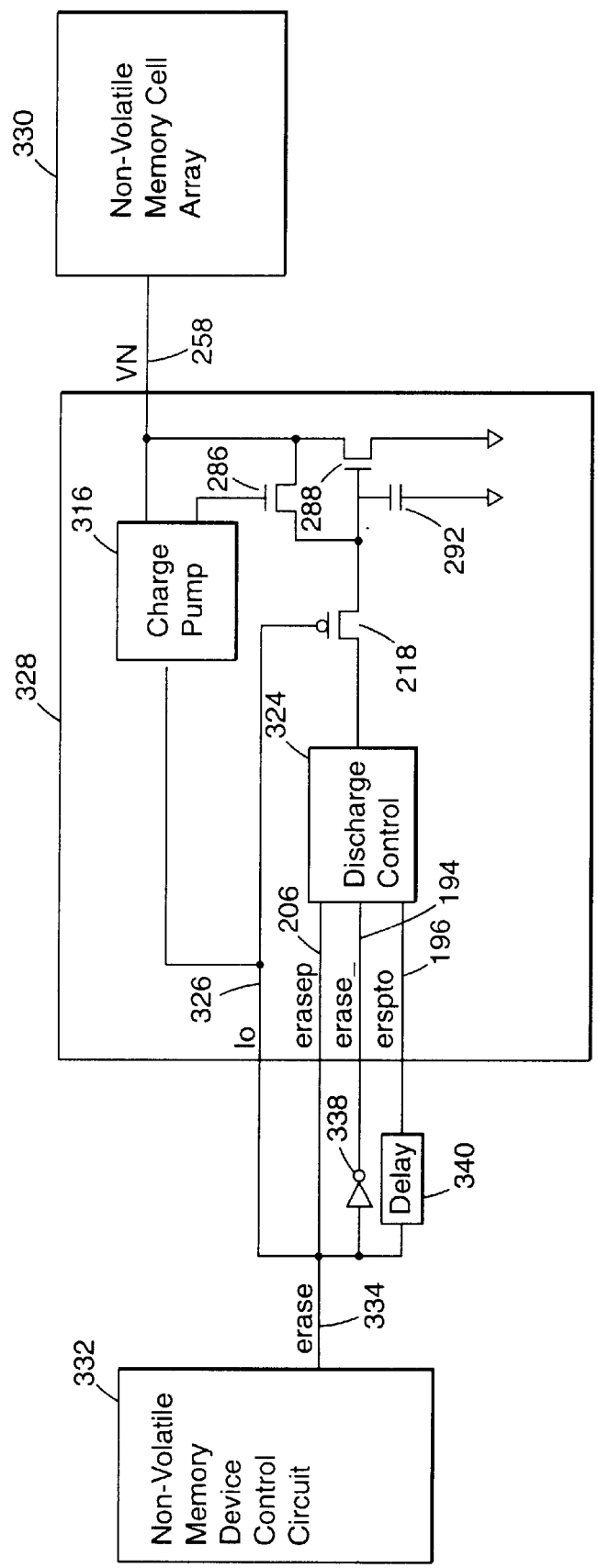
FIG. 15 is an example of a non-volatile memory device and control circuitry with the programming voltage discharge circuit of FIG. 13.

Shown in FIG. 15 is an example of the discharge control circuit and charge pump circuit of FIG. 13 incorporated into a non-volatile memory device and showing how the control signals erspto 196, erase_194, erasep 206, and lo 326 may be generated. In the circuit of FIG. 15, circuit 328 contains a simplified embodiment of the circuit of FIG. 13. Circuit 328 is shown with the discharge control circuit 324, charge pump 316, PMOS isolation transistor 218, NMOS isolation transistor 286, discharge control capacitor 292 and the NMOS discharge transistor 288. The output of the discharge control circuit and charge pump circuit of circuit 328, circuit node VN 258, is coupled to a non-volatile memory cell array 330 and provides the programming voltage (−V) for the non-volatile memory to erase and program the array. The non-volatile memory device control circuit 332 is shown generating control signal erase 334, which is active when the memory device of FIG. 15 is in an erase/programming operation. For the discharge control circuit and charge pump circuit of circuit 328 control signals lo 326 and erasep 206 are coupled directly to the control signal erase 334 from memory device control circuit 332. The signal erase_194 is coupled to control signal erase 334 through inverter 338 and erspto 196 is coupled to control signal erase 334 through delay element 340 to provide the delayed signal to trigger discharge operation in discharge control 324.

Figure 16:
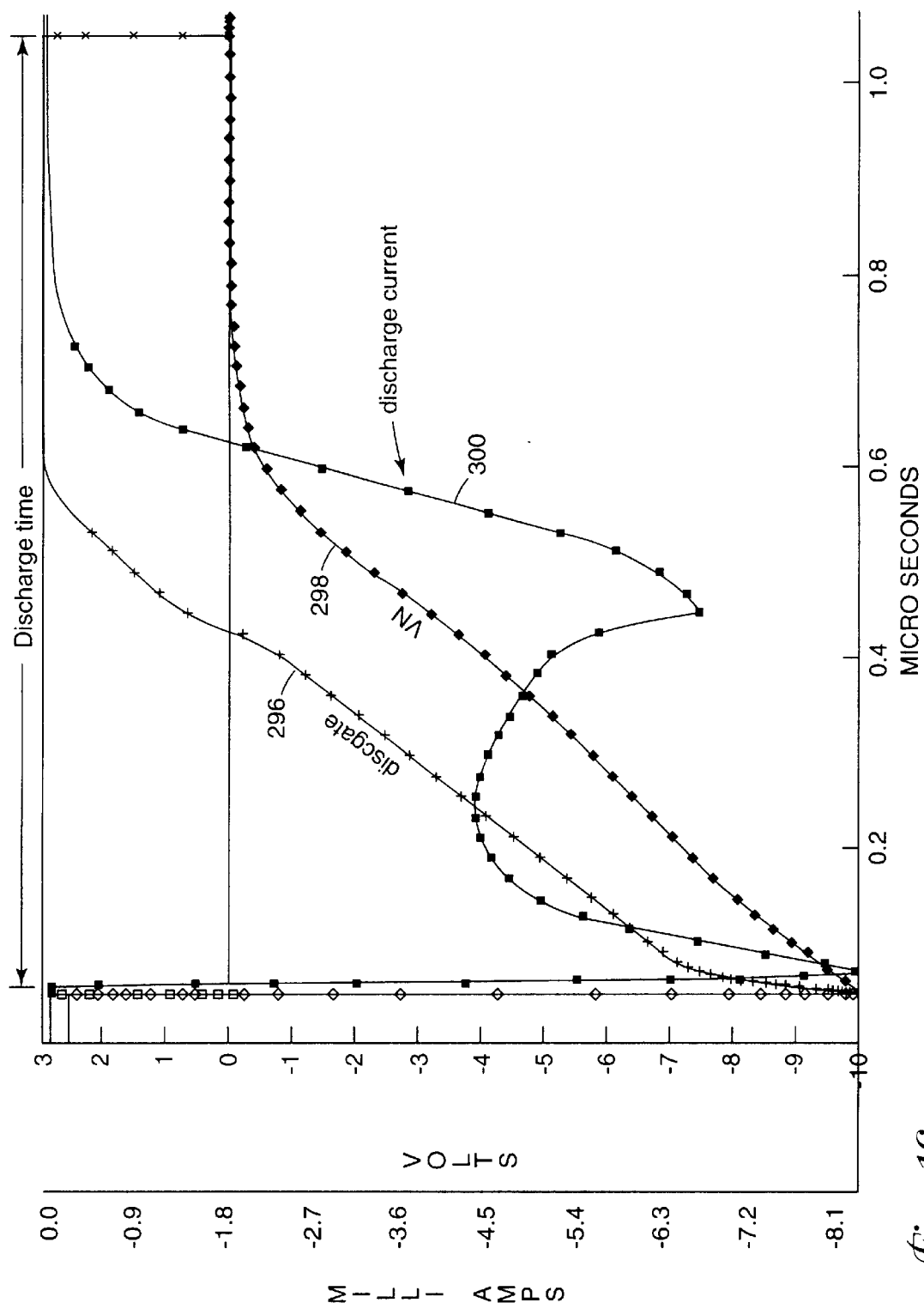
FIG. 16 is a graph showing the relationship between a discharge gate signal, programming voltage signal, and discharge current during a controlled discharge with the circuit of FIG. 13.

Shown in FIG. 16 is a graph showing the waveforms of several signals from the discharge circuit of FIG. 13. The gate control voltage produced by the discharge circuit of FIG. 13 for NMOS discharge transistor 288 is shown transitioning from −V =$V_{prog}$=−10V to Vcc=3V in waveform 296. The gradually discharging charge pump output signal (VN) 258 as it transitions from −V=$V_{prog}$=−10V to ground is shown in waveform 298. Finally, the discharge current produced by the discharge control circuit is shown in waveform 300.

Figure 17:
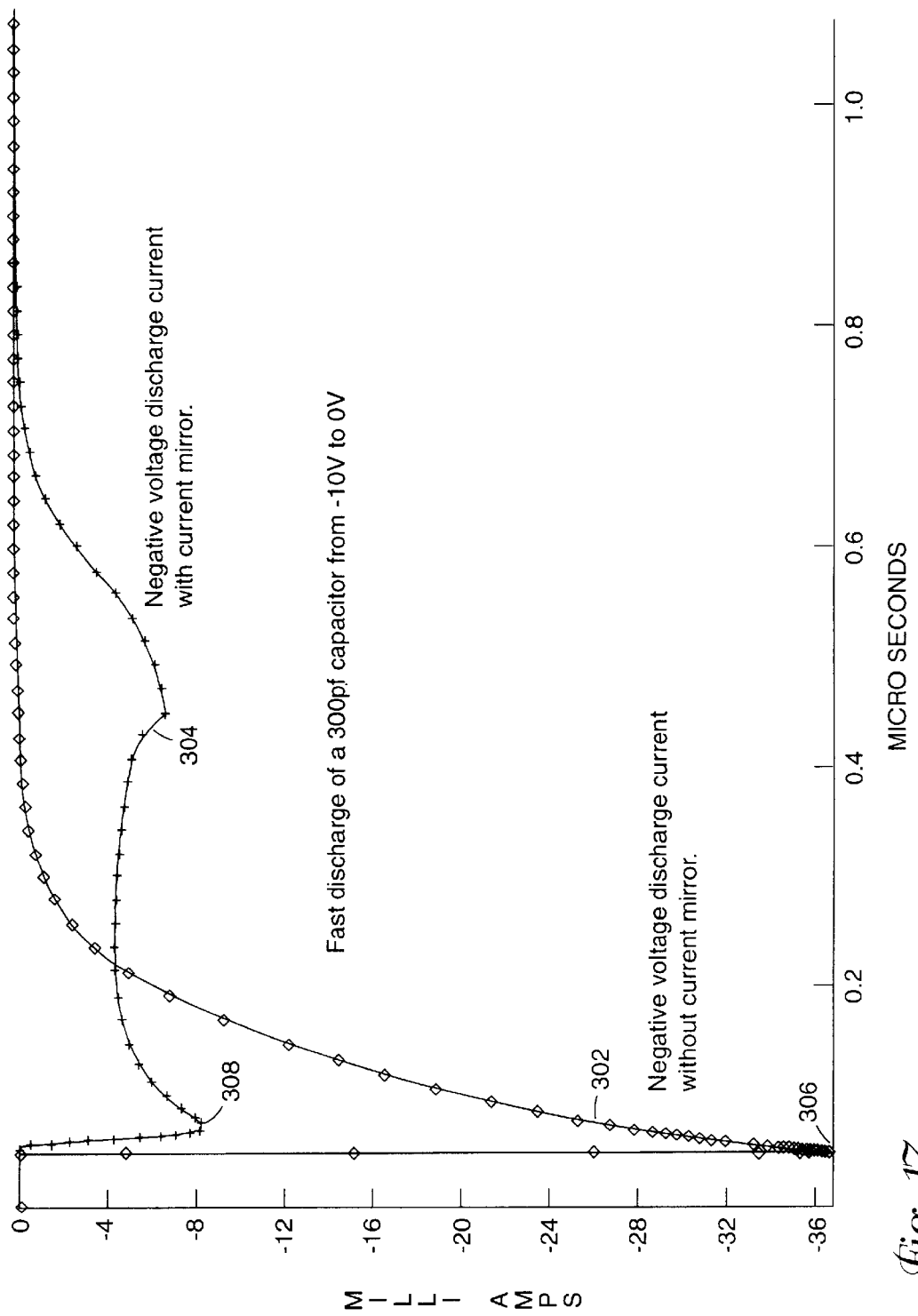
FIG. 17 is a graph contrasting discharge current waveforms of a controlled and uncontrolled discharge of a programming voltage with the circuit of FIG. 13.

A comparison graph of programming voltage source discharge currents with and without a discharge control circuit of the specific invention are shown in FIG. 17. As illustrated, the discharge current waveform of the memory device without a discharge control circuit 302 has a much higher peak current 306 (−36 mA) than the peak current 308 (−8 mA) of the memory device with a discharge control circuit 304.

CONCLUSION

A programming voltage discharge control system has been described that reduces noise from programming voltage discharge in a non-volatile memory. The memory includes a non-volatile memory array having a plurality of floating gate memory cells coupled to bit lines. A voltage source, typically a charge pump circuit, generates an elevated programming voltage for the memory device. The elevated programming voltage is utilized by the memory device in the non-volatile memory array to erase or program memory cells. After an erase or programming operation, the memory device disables the elevated voltage source and discharges the remaining programming voltage. A discharge control circuit gradually discharges all of, or the initial component of, the remaining programming voltage charge to ground. The discharge control circuit, therefore, reduces noise caused by a large discharge current spike in the non-volatile memory device.

It is noted that, while the descriptions and illustrations contained herein focus on embodiments that contain negative programming voltages, it will be appreciated that positive voltages may be also managed. However, the discharge of positive programming voltages may require that specific transistor arrangements to be changed.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A memory device comprising:
   a charge pump to provide an output voltage; and
   a discharge circuit coupled to discharge the output voltage of the charge pump when the charge pump transitions from active to inactive operation, wherein the discharge circuit has a controllable discharge current path to control a discharge time of the output voltage.

2. The memory device of claim 1 wherein the discharge circuit comprises:
   a discharge transistor coupled to the charge pump; and
   a control circuit coupled to a gate of the discharge transistor to regulate a gate voltage such that the discharge transistor is operated in a linear region to control the discharge time of the output voltage.

3. The memory device of claim 2 wherein the control circuit ramps the gate voltage during a first time period of the discharge time.

4. The memory device of claim 3 wherein the control circuit comprises:
a pull-up circuit coupled to the gate of the discharge transistor, wherein the pull-up circuit provides a controllable ramped voltage to the gate of the discharge transistor.

5. The memory device of claim 3 wherein the control circuit couples the gate voltage to an upper supply voltage during a second time period of the discharge time.

6. The memory device of claim 1 wherein the discharge circuit comprises:
a discharge transistor coupled between an output connection of the charge pump and a discharge voltage connection;
a control transistor coupled between the output connection of the charge pump and a gate of the discharge transistor, the control transistor is selectively activated during operation of the charge pump;
a capacitor coupled to the gate of the discharge transistor, wherein the capacitor is charged by the charge pump output voltage during the operation of the charge pump; and
a control circuit having an output node coupled to regulate a gate voltage of the discharge transistor such that the discharge transistor is operated in a linear region to control the discharge time of the output voltage.

7. The memory device of claim 6 wherein the control circuit comprises:
a first pull-up circuit coupled to the output node;
a current mirror circuit to control a pull-up current of the first pull-up circuit; and
a second pull-up circuit coupled to the output node.

8. The memory device of claim 1 further comprising an array of non-volatile memory cells.

9. The memory device of claim 1 wherein the charge pump output voltage is a negative voltage.

10. A memory device comprising:
a charge pump to provide an output voltage on an output connection; and
a discharge circuit coupled to the output connection of the charge pump, the discharge circuit comprises:
a discharge transistor coupled between the output connection of the charge pump and a discharge voltage connection,
a control transistor coupled between the output connection and a gate of the discharge transistor, the control transistor is selectively activated during operation of the charge pump,
a capacitor coupled to the gate of the discharge transistor, wherein the capacitor is charged by the charge pump output voltage during the operation of the charge pump;
a control circuit having an output node coupled to regulate a gate voltage of the discharge transistor such that the discharge transistor is operated in a linear region to control the discharge time of the output voltage when the charge pump transitions from active to inactive operation, and an isolation transistor coupled between the gate of the discharge transistor and the control circuit.

11. The memory device of claim 10 wherein the control circuit comprises:
a first pull-up circuit coupled to the output node;
a current mirror circuit to control a pull-up current of the first pull-up circuit; and
a second pull-up circuit coupled to the output node, wherein the first pull-up circuit is activated during a first discharge time period to control a discharge current of the discharge transistor, and the second pull-up circuit is activated during a second subsequent discharge time period fully activate the discharge transistor.

12. The memory device of claim 11 where a length of the first discharge time period can be selectively controlled.

13. The memory device of claim 11 wherein a current conducted by the current mirror circuit can be selectively adjusted.

14. The memory device of claim 11 further comprising an array of non-volatile memory cells.

15. The memory device of claim 11 wherein the charge pump output voltage is a negative voltage.

16. A flash memory device comprising:
an array of non-volatile memory cells;
a charge pump to provide a negative output voltage on an output node; control circuitry to control data states of the memory cells using the negative output voltage; and
a discharge circuit coupled to the output node of the charge pump to discharge the negative voltage when the charge pump transitions from active to inactive operation using a discharge transistor operated in a linear region to regulate a discharge current conducted by the discharge transistor.

17. The flash memory of claim 16 wherein the discharge circuit comprises:
a control transistor coupled between the output node and a gate of the discharge transistor, the control transistor is selectively activated during operation of the charge pump;
a capacitor coupled to the gate of the discharge transistor, wherein the capacitor is charged by the charge pump output voltage during the operation of the charge pump;
a control circuit having an output connection coupled to regulate a gate voltage of the discharge transistor; and
an isolation transistor coupled between the gate of the discharge transistor and the control circuit.

18. The flash memory of claim 17 wherein the control circuit comprises:
a first pull-up circuit coupled to the output connection;
a current mirror circuit to control a pull-up current of the first pull-up circuit; and
a second pull-up circuit coupled to the output connection, wherein the first pull-up circuit is activated during a first discharge time period to control a discharge current of the discharge transistor, and the second pull-up circuit is activated during a second subsequent discharge time period fully activate the discharge transistor.

19. A method of operating a memory device comprising:
generating a charge pump voltage on a charge pump output; and discharging the charge pump voltage using a regulated discharge circuit when a charge pump coupled to the charge pump output transitions from active to inactive operation, wherein the regulated discharge circuit provides an adjustable discharge time period.

20. The method of claim 19 wherein the adjustable discharge period comprises:
a first time where the discharge circuit ramps a discharge current through the discharge circuit; and
a second subsequent time where the discharge circuit provides a substantially constant discharge current through the discharge circuit.

21. The method of claim 19 wherein the discharge circuit comprises a discharge transistor, and the adjustable discharge period comprises:
  a first time where the discharge circuit ramps a gate voltage of the discharge transistor such that a discharge current through the discharge transistor is ramped; and
  a second subsequent time where the discharge transistor operates in saturation to provide a substantially constant discharge current through the discharge circuit.

22. The method of claim 19 wherein the discharge circuit comprises a discharge transistor, and the method further comprises:
  charging a capacitor coupled to a gate of the discharge transistor to the charge pump voltage while the charge pump is active;
  providing a constant current to the capacitor to ramp a voltage of the capacitor to discharge the charge pump voltage.

23. The method of claim 22 wherein the charge pump voltage is a negative voltage.

24. The method of claim 22 wherein the charge pump voltage is a negative voltage, and the discharge transistor is an n-channel transistor.

25. A method of operating a memory device comprising:
  generating a negative charge pump voltage on a charge pump output when the charge pump is in an active mode;
  charging a capacitor to the negative charge pump voltage, wherein the capacitor is coupled to a gate of an n-channel discharge transistor that is coupled to the charge pump output; and
  providing a constant charging current to the capacitor when the charge pump is not in the active mode, such that a voltage of the capacitor is ramped from the negative charge pump voltage to a positive voltage to control a discharge current through the n-channel discharge transistor when the charge pump transitions from active to inactive operation and is no longer generating the negative charge pump voltage.

26. The method of claim 25 wherein the constant current is applied for a predetermined time to discharge only a portion of the negative charge pump voltage.

27. The method of claim 26 further comprising coupling the gate of the channel discharge transistor to an upper supply voltage following the predetermined time.

28. A non-volatile memory comprising:
  an array of non-volatile memory cells;
  a charge pump to provide a programming voltage to the array;
  a discharge transistor coupled to the charge pump to discharge the programming voltage from the charge pump when the charge pump transitions from active to inactive operation and is no longer providing the programming voltage; and
  a discharge control circuit coupled to the discharge transistor to control a rate of discharge.

29. The non-volatile memory of claim 28 wherein the discharge control circuit controls the discharge transistor with a gate signal other than a step function.

30. The non-volatile memory of claim 28 wherein the discharge control circuit controls the discharge transistor with a gate voltage that is a ramp function.

31. The non-volatile memory of claim 28 wherein the discharge transistor is controlled by a gate voltage generated by a control capacitor coupled to a current source.

32. The non-volatile memory of claim 31 wherein the current source comprises:
  a current reference source to generate a reference current; and
  a current mirror coupled to the current source to replicate the reference current and charge the control capacitor.

33. The non-volatile memory of claim 31 wherein a reference current provided by the current source has a selectively adjustable magnitude and time period.

34. A flash memory programming voltage discharge circuit comprising:
  a capacitive load storing a programming voltage;
  a discharge transistor coupled between the capacitive load and a ground voltage connection; and
  a control circuit having a control voltage coupled to a gate of the discharge transistor where the control voltage is selectively ramped to control a current conducted by the discharge transistor when the programming voltage stored by the capacitive load is no longer required.

35. The flash memory programming voltage discharge circuit of claim 34 wherein the programming voltage is negative.

36. The flash memory programming voltage discharge circuit of claim 35 wherein the discharge transistor is an n-channel transistor, and the control voltage ramps from the negative programming voltage to a positive voltage.

37. A method for reducing discharge noise in a memory device comprising:
  providing a programming voltage using a charge pump circuit;
  activating a discharge transistor coupled to the charge pump when the charge pump circuit transitions from active to inactive operation; and
  regulating a gate voltage of the discharge transistor to control a current flowing through the discharge transistor.

38. The method of claim 37 wherein regulating the gate voltage comprises:
  charging a capacitor coupled to a gate of the discharge capacitor to the programming voltage; and
  providing a constant current to the capacitor to ramp the voltage on the gate.

39. The method of claim 38 wherein the programming voltage is a negative voltage.

40. A memory system comprising:
  an processor; and
  a non-volatile memory coupled to the processor, the non-volatile memory comprising,
    an array of non-volatile memory cells,
    a charge pump to generate a programming voltage for the array,
    a discharge circuit to discharge the programming voltage from the charge pump when the charge pump transitions from active to inactive operation, and
  a discharge control circuit coupled to the discharge circuit to regulate a rate of discharge.

41. The memory system of claim 40 wherein the discharge circuit comprises:
  a discharge transistor coupled between an output connection of the charge pump and a discharge voltage connection;
  a control transistor coupled between the output connection of the charge pump and a gate of the discharge transistor, the control transistor is selectively activated during operation of the charge pump; and a capacitor coupled to the gate of the discharge transistor, wherein the capacitor is charged by the charge pump output voltage during the operation of the charge pump.

42. The memory system of claim 41 wherein the discharge control circuit has an output node coupled to regulate a gate voltage of the discharge transistor such that the discharge transistor is operated in a linear region to control the discharge time of the output voltage.

43. The memory system of claim 42 wherein the control circuit comprises:
   a first pull-up circuit coupled to the output node;
   a current mirror circuit to control a pull-up current of the first pull-up circuit; and
   a second pull-up circuit coupled to the output node.

* * * * *

UNITED STATES PATENT AND TRADEMARK OFFICE
CERTIFICATE OF CORRECTION

PATENT NO. : 6,438,032 B1
DATED : August 20, 2002
INVENTOR(S) : Theodore T. Pekny It is certified that error appears in the above-identified patent and that said Letters Patent is hereby corrected as shown below:

Title page,
Item [73], Assignee: "Micron Telecommunications, Inc., Boise, ID (US)" replace "Telecommunications" with -- Technology --

Column 5,
Line 1, replace "to with -- $t_0$ --
Line 21, replace "to" with -- $t_0$ --

Signed and Sealed this

Sixteenth Day of March, 2004

JON W. DUDAS
*Acting Director of the United States Patent and Trademark Office*